(12) United States Patent
Kujirai

(10) Patent No.: US 8,455,944 B2
(45) Date of Patent: Jun. 4, 2013

(54) SEMICONDUCTOR DEVICE HAVING A TRENCH-GATE TRANSISTOR

(75) Inventor: Hiroshi Kujirai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 20 days.

(21) Appl. No.: 13/185,912

(22) Filed: Jul. 19, 2011

(65) Prior Publication Data

US 2011/0272760 A1 Nov. 10, 2011

Related U.S. Application Data

(63) Continuation of application No. 11/604,728, filed on Nov. 28, 2006, now Pat. No. 8,013,386.

(30) Foreign Application Priority Data

Dec. 8, 2005 (JP) .................................. 2005-355329

(51) Int. Cl.
*H01L 29/66* (2006.01)

(52) U.S. Cl.
USPC .................. 257/330; 257/E29.201; 257/332; 438/259

(58) Field of Classification Search
USPC ...... 257/E29.26, 329–340, E29.201; 438/259
See application file for complete search history.

(56) References Cited

U.S. PATENT DOCUMENTS

| 5,808,340 | A | 9/1998 | Wollesen et al. |
| 6,222,230 | B1 | 4/2001 | Gardner et al. |
| 6,413,802 | B1 | 7/2002 | Hu et al. |
| 7,285,466 | B2 | 10/2007 | Kim et al. |
| 7,473,963 | B2 | 1/2009 | Kim et al. |
| 2005/0032322 | A1 | 2/2005 | Kim et al. |
| 2005/0040475 | A1* | 2/2005 | Jang et al. ..................... 257/396 |

FOREIGN PATENT DOCUMENTS

| JP | 07-066297 | 3/1995 |
| JP | 08-274277 | 10/1996 |
| JP | 09-232535 | 9/1997 |
| JP | 2001-210801 | 8/2001 |
| JP | 2004-014696 | 1/2004 |
| JP | 2004-281782 | 10/2004 |
| JP | 2005-057293 | 3/2005 |
| JP | 2005-142203 | 6/2005 |
| JP | 2005-167132 | 6/2005 |

OTHER PUBLICATIONS

JP Office Action dated Dec. 6, 2011, with English Translation.

* cited by examiner

*Primary Examiner* — Eva Yan Montalvo
(74) *Attorney, Agent, or Firm* — Young & Thompson

(57) ABSTRACT

A semiconductor device includes, on a semiconductor substrate, an active region surrounded by an STI region, a gate trench formed in one direction transverse to the active region, a gate insulating film formed on a side surface of the gate trench, an insulating film formed on a bottom of the gate trench and thicker than the gate insulating film, and a gate electrode having at least a part of the gate electrode formed in the gate trench. Portions of the semiconductor substrate present in the active region and located on both sides of the gate trench in an extension direction of the gate trench function as a source region and a drain region, respectively. A portion of the semiconductor substrate located between the side surface of the active region (the side of the STI region) and the side surface of the gate trench functions as a channel region.

10 Claims, 18 Drawing Sheets

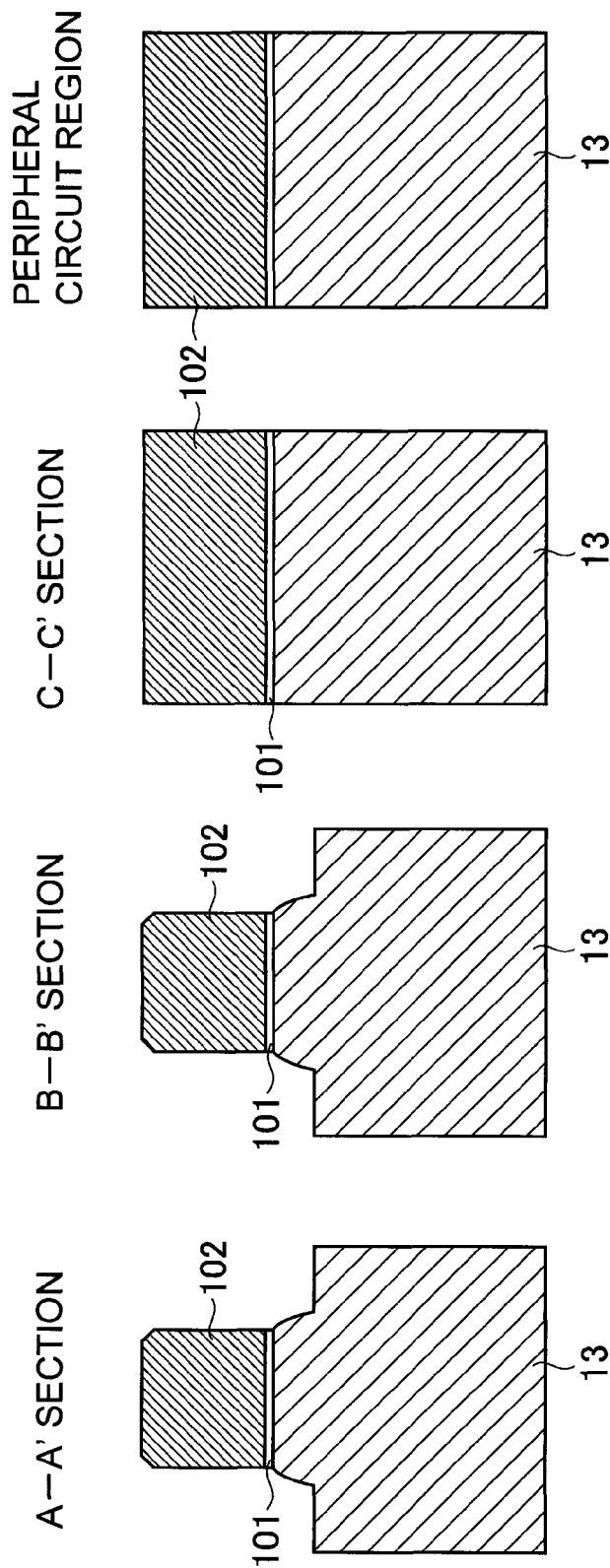

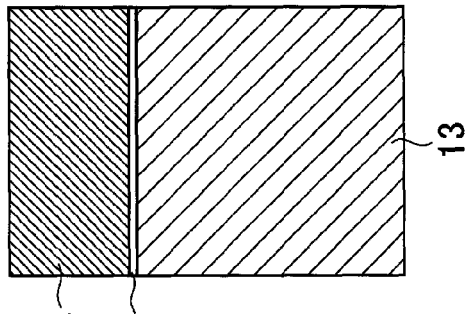
FIG.5D
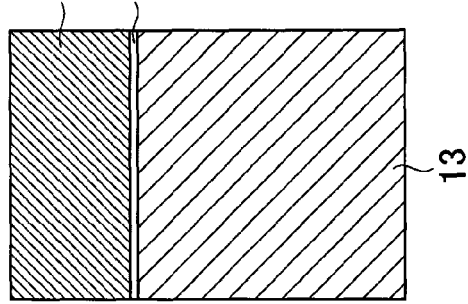
FIG.5C
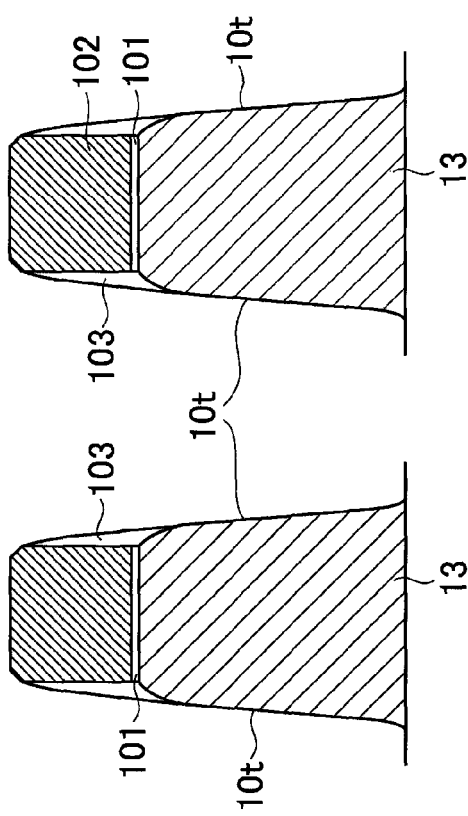
FIG.5B
FIG.5A

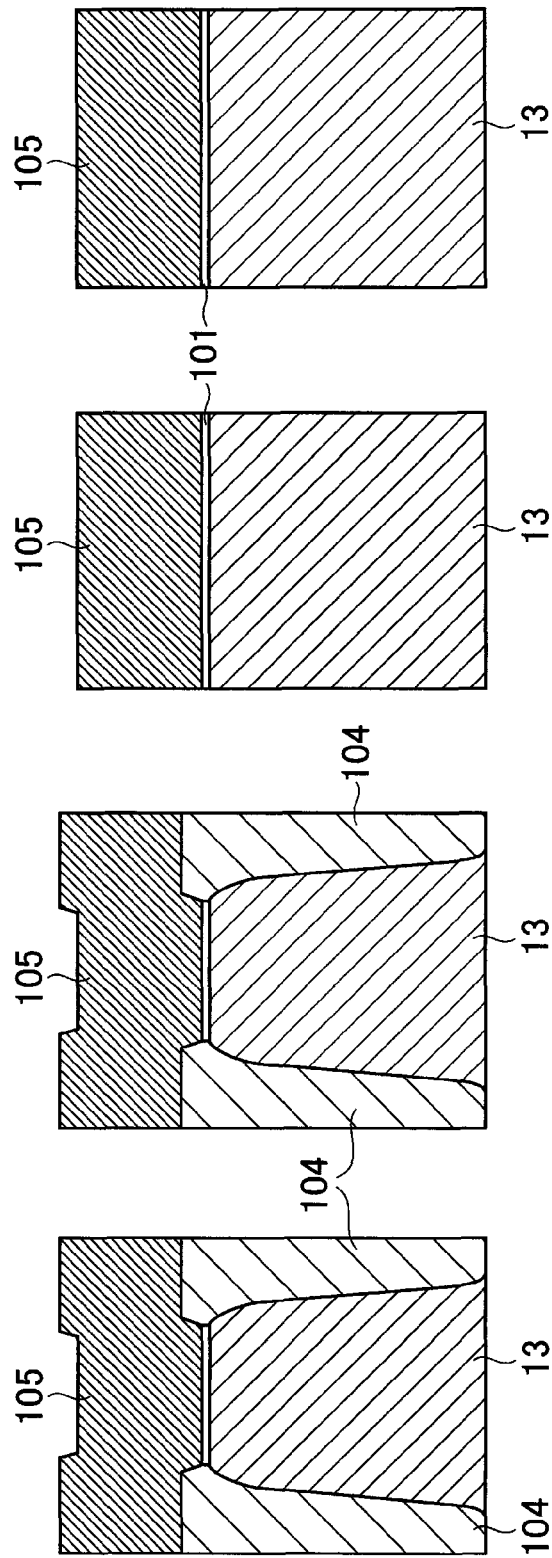

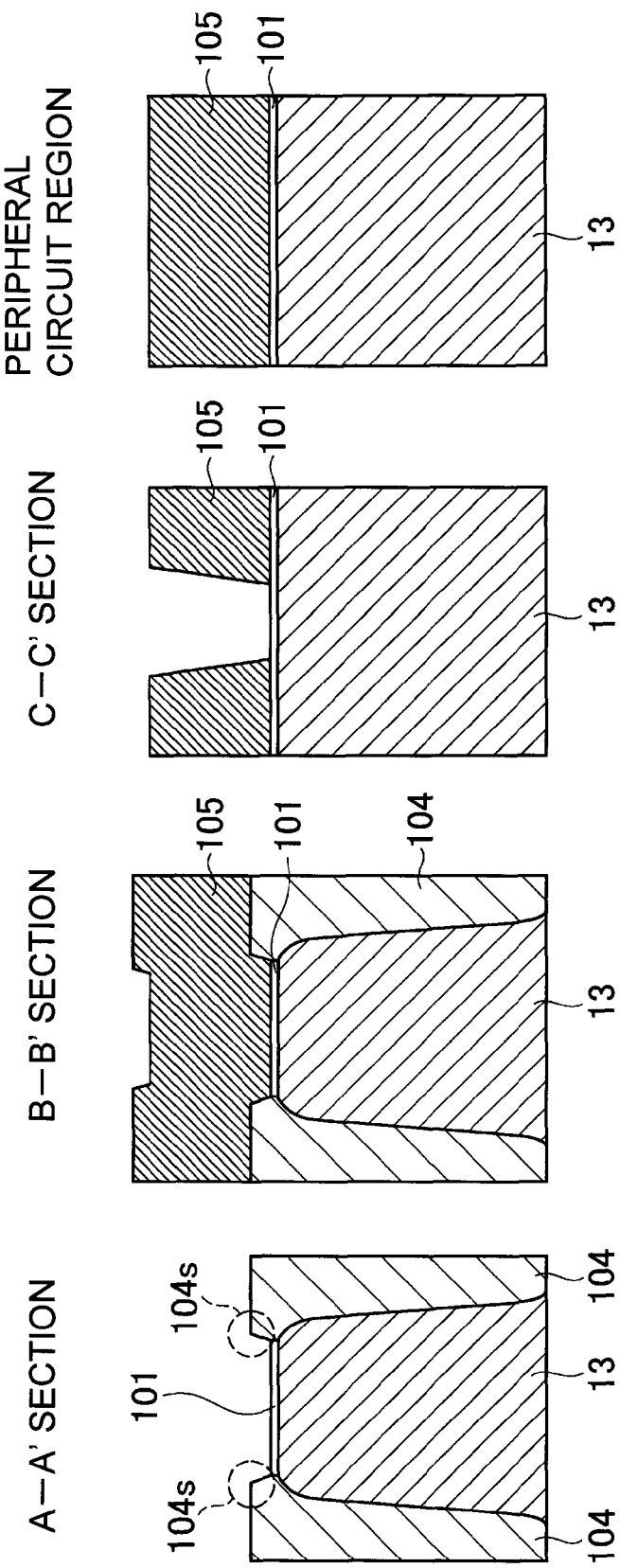

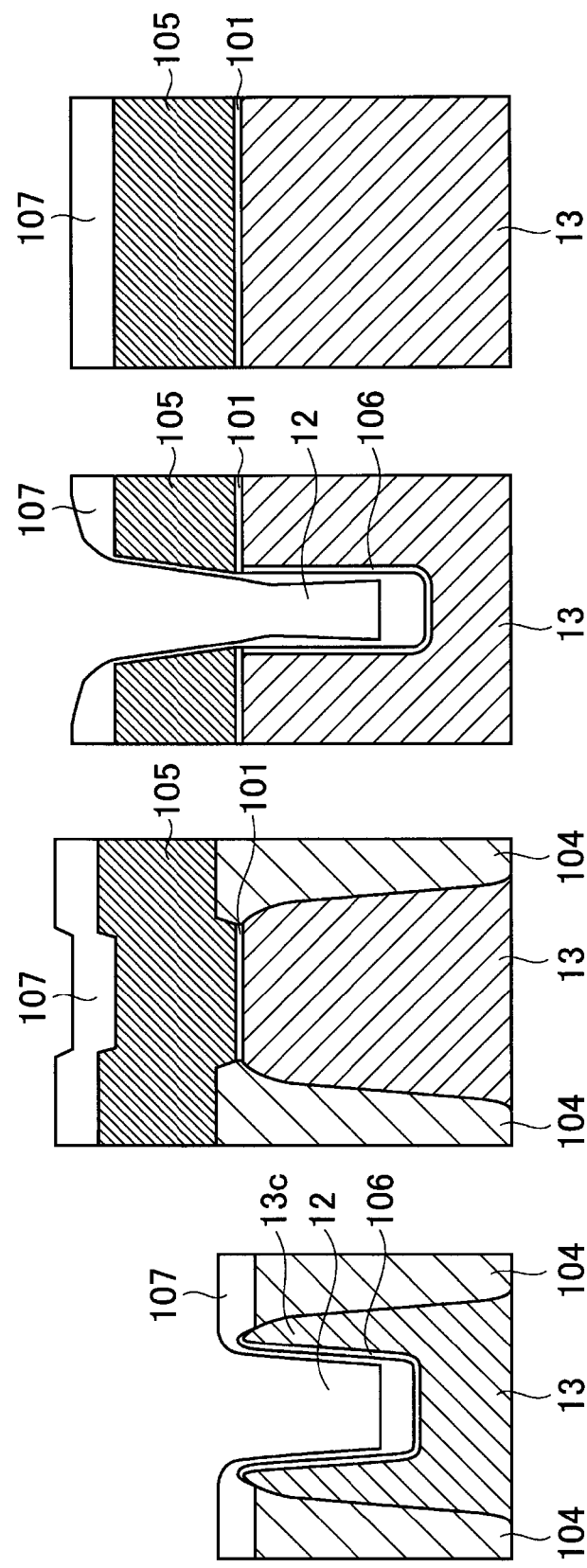

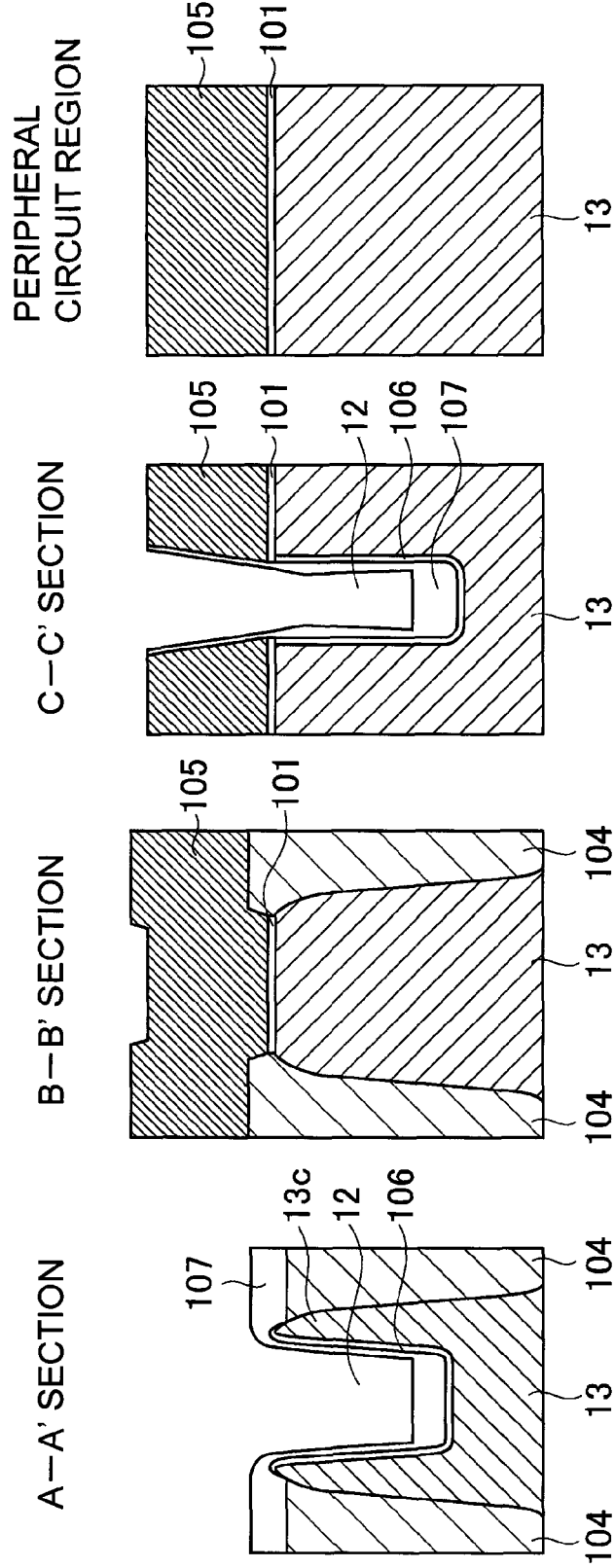

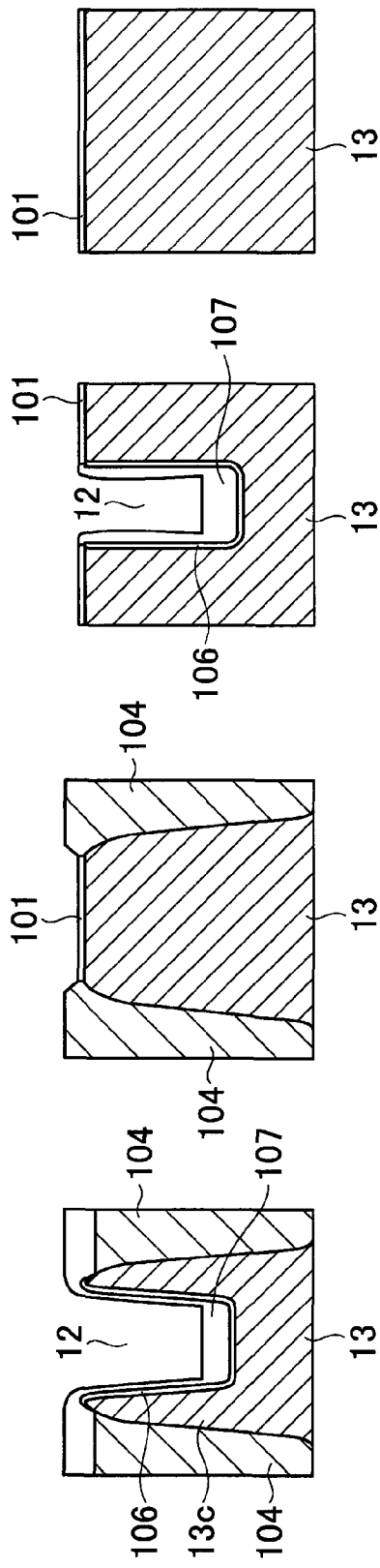

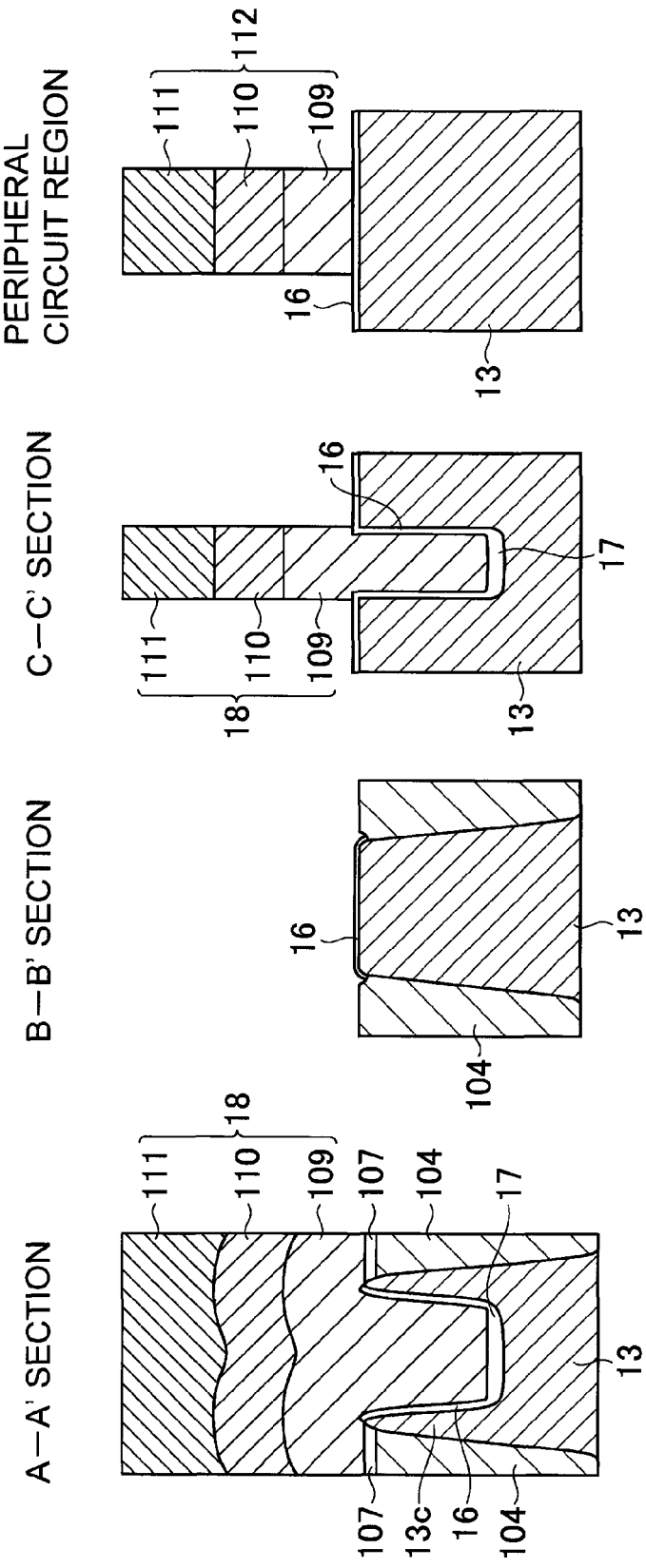

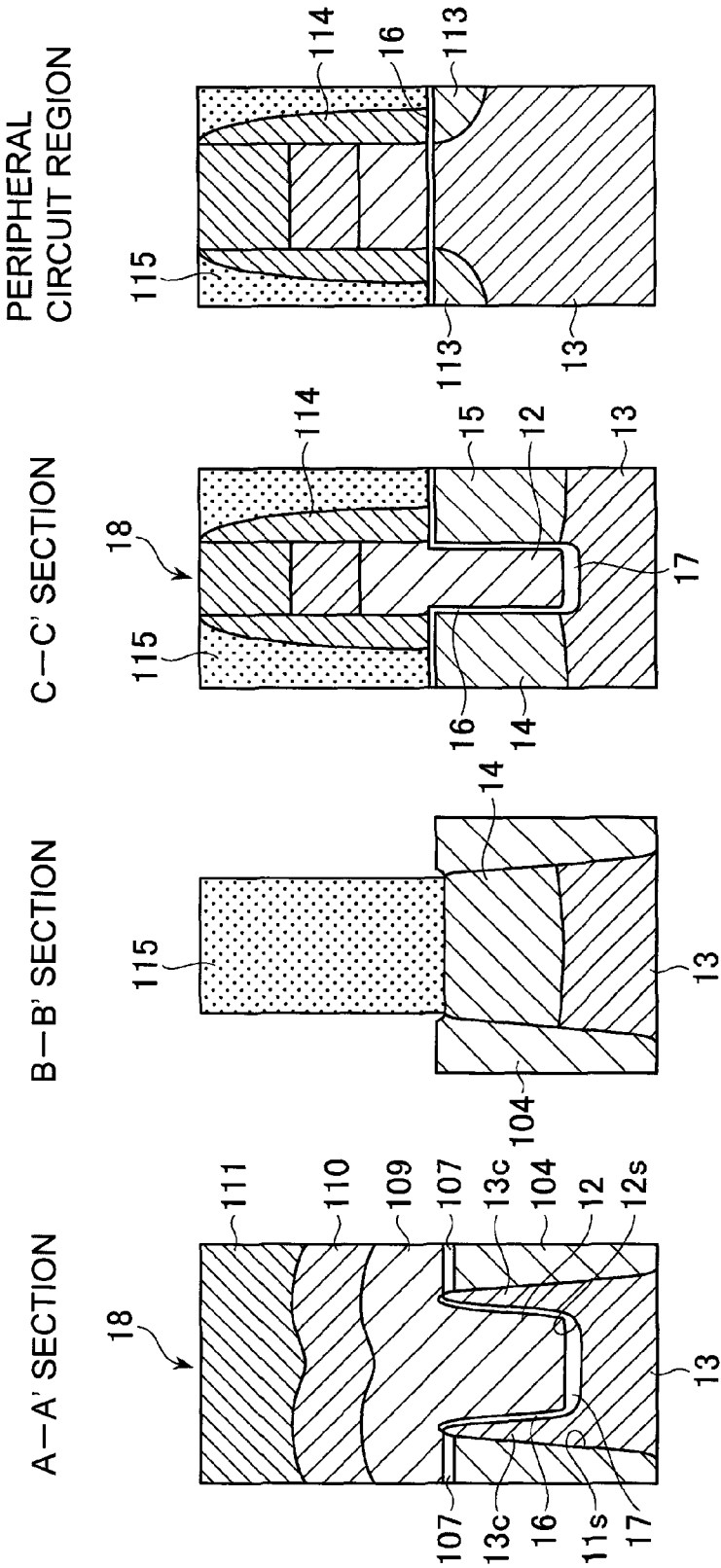

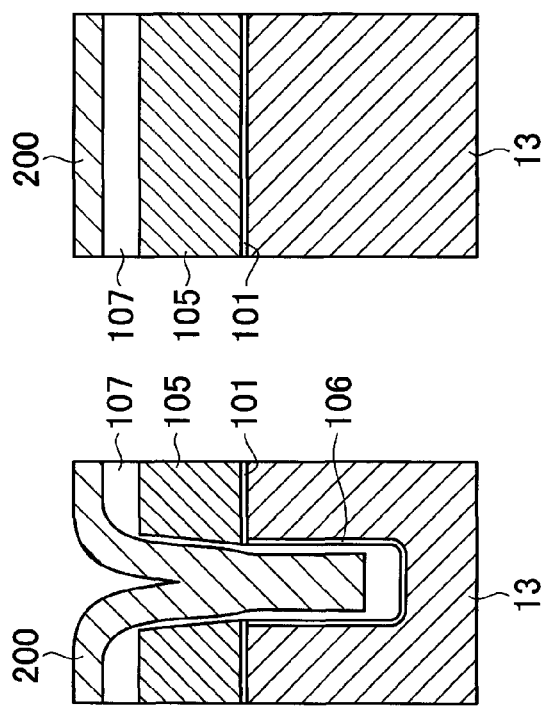
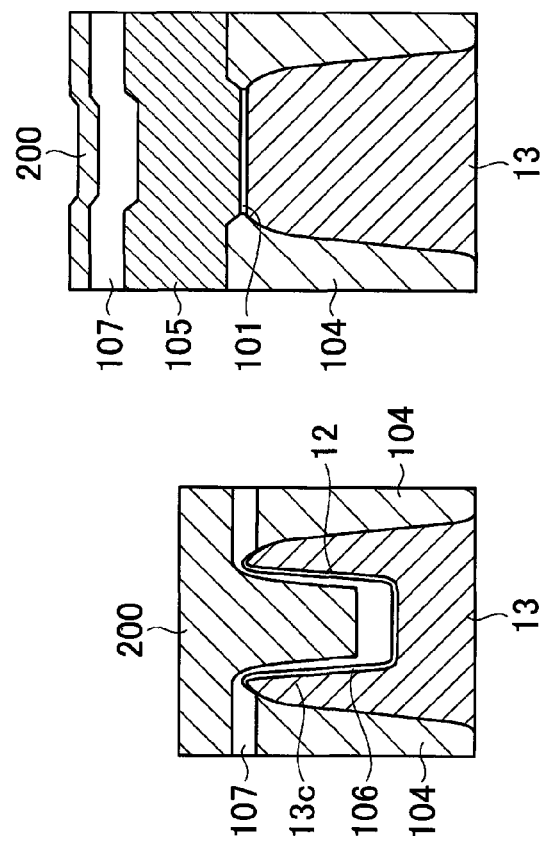

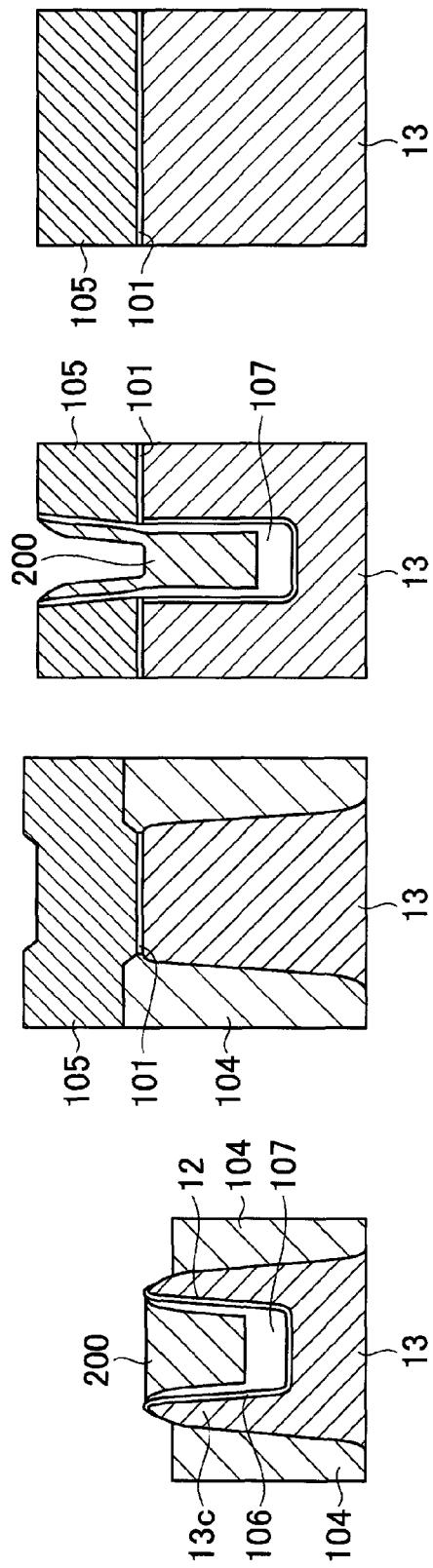

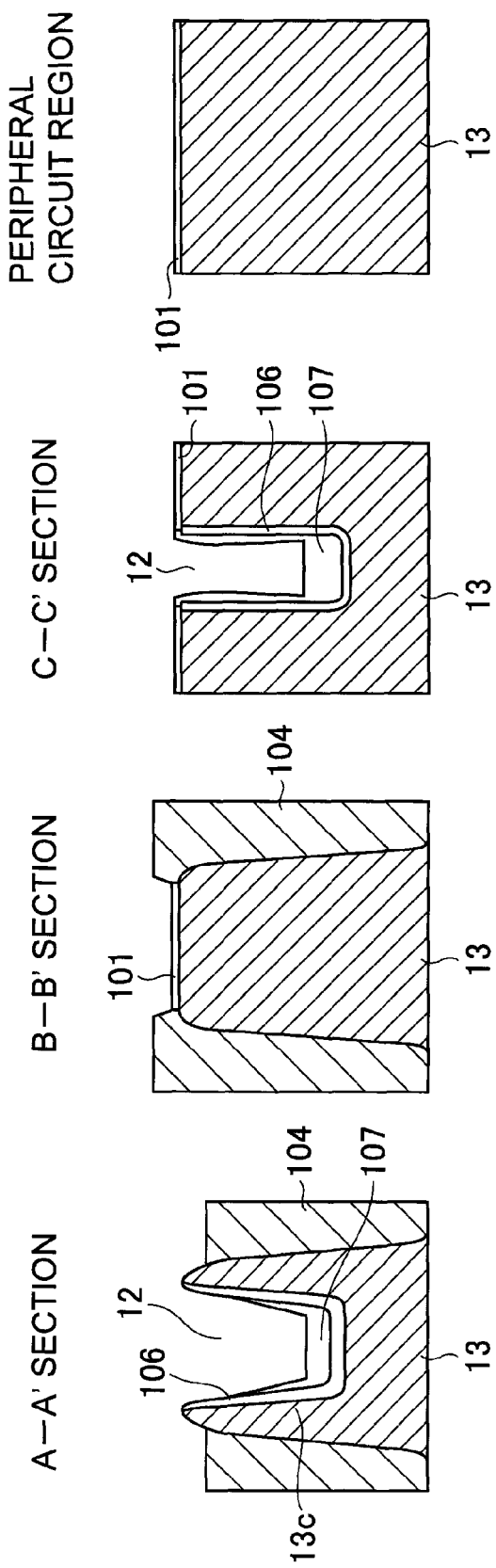

SEMICONDUCTOR DEVICE HAVING A TRENCH-GATE TRANSISTOR

TECHNICAL FIELD

The present invention relates to a semiconductor device and manufacturing method thereof, and more particularly relates to a semiconductor device including a trench-gate transistor and manufacturing method thereof.

BACKGROUND OF THE INVENTION

In recent years, a shortening of the gate length of a memory cell transistor is necessary because a reduction of a cell size is required in a DRAM (Dynamic Random Access Memory). However, if the gate length is smaller, then the short channel effect of the transistor becomes greater, and sub-threshold current disadvantageously increases. Furthermore, if sub-strate concentration is increased in order to suppress an increase in the sub-threshold current, junction leakage increases. As a result, the DRAM is confronted with a serious problem of deteriorated refresh characteristics.

To avoid the problem, attention has been paid to a so-called trench-gate transistor (also "recess-channel transistor") configured so that a gate electrode is buried in a groove formed in a semiconductor substrate (see Japanese Patent Application Laid-open Nos. H9-232535, 2001-210801, 2005-142203, H7-66297, and 2004-14696). The trench-gate transistor can sufficiently secure an effective channel length (a gate length) and enables achieving a fine DRAM having a minimum machining dimension of 90 nm or less.

However, the conventional trench-gate transistor has the following problem. Although the short channel effect can be suppressed, further improvement is necessary for increasing drive current, reducing parasitic capacitance and the like to improve circuit delay.

SUMMARY OF THE INVENTION

It is therefore an object of the present invention to provide a semiconductor device including a trench-gate transistor having improved performance and a method of manufacturing the semiconductor device.

The above and other objects of the present invention can be accomplished by a semiconductor device comprising:
an STI (Shallow Trench Isolation) region formed on a semiconductor substrate;
an active region surrounded by the STI region;
a gate trench formed in a predetermined direction to transverse the active region;
a gate insulating film formed on a side surface of the gate trench;
an insulating film that is formed on a bottom of the gate trench and is thicker than the gate insulating film; and
a gate electrode, at least a part of which is formed in the gate trench, wherein
said semiconductor substrate present in the active region includes a first portion located on both sides of the gate trench with respect to the predetermined direction and a second portion located between a side surface of the STI region and the side surface of the gate trench,
said first portion of the semiconductor substrate functions as a source region and a drain region,
said second portion of the semiconductor substrate functions as a channel region.

The above and other objects of the present invention can also be accomplished by method of manufacturing a semiconductor device comprising:
a first step of forming an STI region and an active region surrounded by the STI region in a semiconductor substrate;
a second step of forming the gate trench in a predetermined direction to transverse the active region so as to leave a part of the semiconductor substrate between a side surface of the STI region and a side surface of a gate trench;
a third step of forming a thick insulating film on a bottom of the gate trench;
a fourth step of forming a thin gate insulating film on the side surface of the gate trench, the thin gate insulating film being thinner than the thick insulating film;
a fifth step of forming a gate electrode at least a part which is buried in the gate trench; and
a sixth step of forming a source region and a drain region in portions of the semiconductor substrate present in the active region and located on both sides of the gate trench with respect to the predetermined direction, respectively, so that the part of the semiconductor substrate serves as a channel region.

According to the present invention, the portion of the semiconductor substrate located between the side surface of the STI region and the side surface of the gate trench functions as the channel region. The thickness of the portion of the semiconductor substrate to serve as the channel region can be reduced by adjusting the distance between the STI region and the gate trench, the inclination angle of the side surface of the STI trench, and the like. Therefore, it is possible to form the completely depleted device that can suppress the short channel effect, even if the impurity concentration of the semiconductor substrate is low. Further, the insulating film thicker than the gate insulating film is formed on the bottom of the gate trench. It is thereby possible to reduce the parasitic capacitance of the gate electrode (the word line, if the present invention is applied to the memory cell transistor), which result in improving circuit delay. Therefore, according to the present invention, the concentration of the semiconductor substrate can be reduced to thereby improve the refresh characteristics, and the parasitic capacitance of the word line can be reduced to thereby improve circuit delay.

Further, if the depth of the STI region and that of the gate trench are increased, the channel width can be increased. Therefore, it is possible to form a transistor in which drive current can be sufficiently applied without increasing the area of the element, even if the voltage applied to the gate electrode is set low.

BRIEF DESCRIPTION OF THE DRAWINGS

The above and other objects, features and advantages of this invention will become more apparent by reference to the following detailed description of the invention taken in conjunction with the accompanying drawings, wherein:

FIGS. 4A to 4D are cross-sectional views showing a step of patterning a pad oxide film and a silicon nitride film in the first embodiment;

FIGS. 5A to 5D are cross-sectional views showing a step of forming a sidewall oxide film and an STI trench in the first embodiment;

FIGS. 7A to 7D are cross-sectional views showing a step of forming a silicon nitride film in the first embodiment;

FIGS. 8A to 8D are cross-sectional views showing a step of patterning the silicon nitride film in the first embodiment;

FIGS. 10A to 10D are cross-sectional views showing a step of forming a sacrificial oxide film and a silicon oxide film in the first embodiment;

FIGS. 11A to 11D are cross-sectional views showing a step of removing the silicon oxide film by CMP in the first embodiment;

FIGS. 12A to 12D are cross-sectional views showing a step of removing the silicon nitride film in the first embodiment;

FIGS. 14A to 14D are cross-sectional views showing a step of forming a gate insulating film, a trench gate electrode and a gate electrode in the first embodiment;

FIGS. 15A to 15D are cross-sectional views showing a step of forming source and drain regions, sidewall insulating films and a contact plug in the first embodiment;

FIGS. 16A to 16D are cross-sectional views showing a step of forming a TEOS-NSG oxide film in a second embodiment;

FIGS. 17A to 17D are cross-sectional views showing a step of etching back the TEOS-NSG oxide film and a silicon oxide film in a second embodiment; and FIGS. 18A to 18D are cross-sectional views showing a step of wet etching the TEOS-NSG oxide film in a second embodiment.

DETAILED DESCRIPTION OF THE EMBODIMENTS

Preferred embodiments of the present invention will now be explained in detail with reference to the drawings.

Two embodiments of the present invention will be described below. The two embodiments are examples of the present invention being applied to a memory cell transistor of a DRAM.

First Embodiment

Figure 1A:
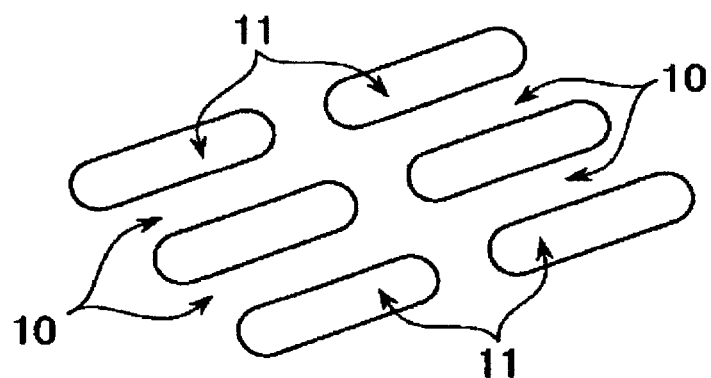
FIG. 1A is a plan view of a plurality of active regions isolated from one another by the STI regions.

FIG. 1A is a plan view of STI regions (element isolation regions) 10 in a memory cell region and a plurality of active regions 11 isolated from one another by the STI regions 10 according to a first embodiment of the present invention. Generally, as shown in FIG. 1A, a plurality of active regions are arranged in the memory cell region almost equally.

Figure 1B:
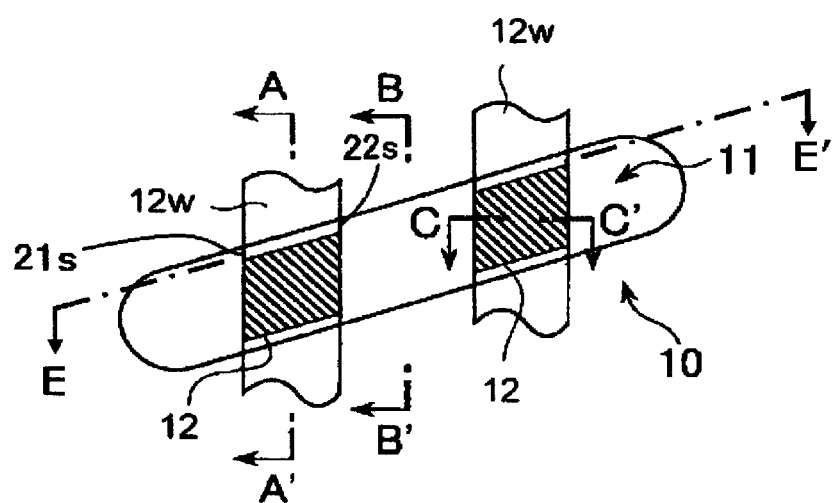
FIG. 1B is an enlarged plan view of one of the active regions shown in FIG. 1A.

FIG. 1B is a plan view of one of the active regions 11 shown in FIG. 1A and the STI regions 10 around the active region 11. Word lines 12w are formed to transverse the active region 11 in one direction. Furthermore, a gate trench 12 is formed in the active region located below each word line 12w.

Figure 2:
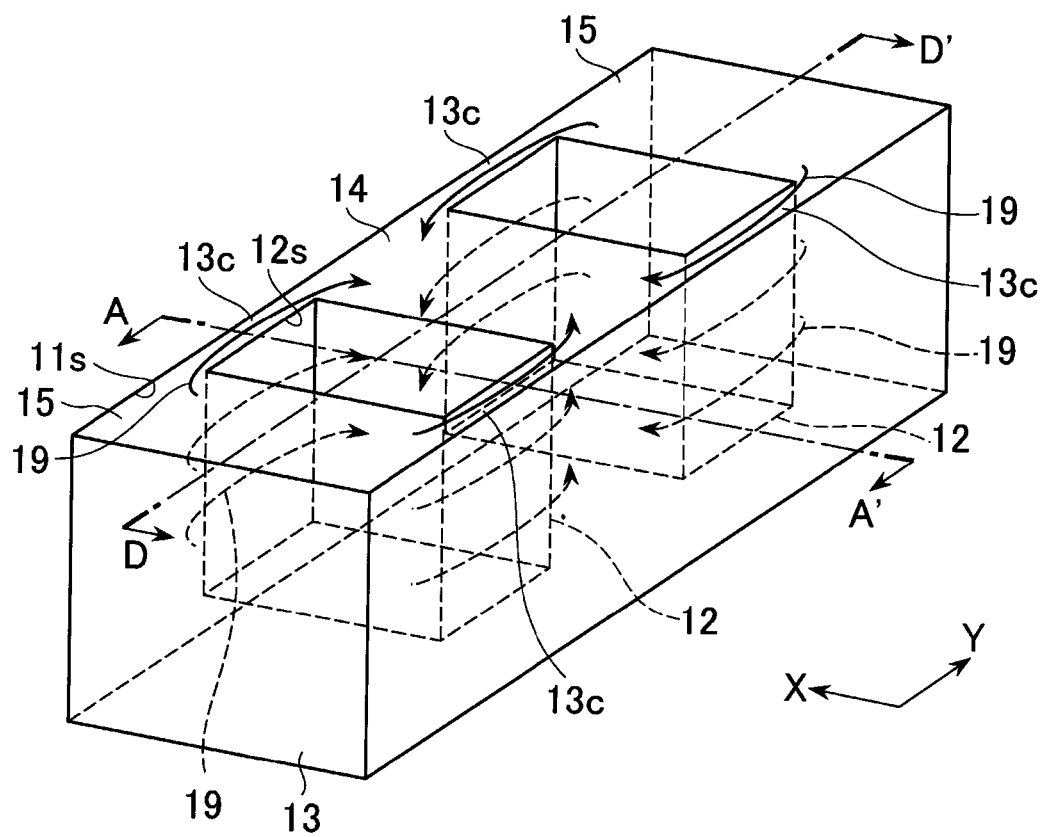
FIG. 2 is a schematic perspective view for explaining the structure of a memory cell transistor according to a first embodiment of the present invention.

FIG. 2 is a schematic perspective view for explaining the structure of a memory cell transistor according to the first embodiment of the present invention. FIG. 2 corresponds to the active region 11 shown in FIG. 1B.

As shown in FIG. 2, a portion 13c of a semiconductor substrate (a silicon substrate) 13 is present between a side surface of the active region (that is, a side surface of the STI region 10) and a side surface 12s of the gate trench 12 with respect to an X direction in which the word line 12w (see FIG. 1B) extends. A part located on both sides of the gate trench 12 serves as a source region 14 and a drain region 15 (also, "first and second diffused regions"), respectively. Since the first embodiment relates to the DRAM, the positions of the source and drain regions can be switched depending on whether operation is write operation or read operation. It is assumed herein that a central region is the source region 14, both regions are drain regions 15, and that the memory cell transistor is an N-channel transistor.

Figure 3A:
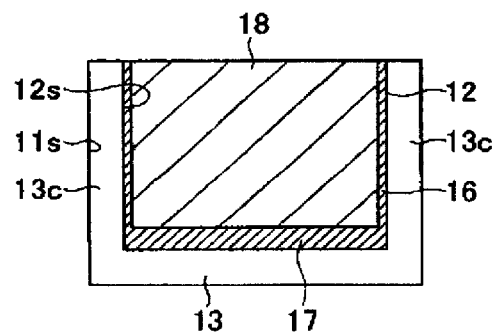
FIG. 3A is a schematic cross-sectional view along a line A-A' shown in FIG. 2.
Figure 3B:
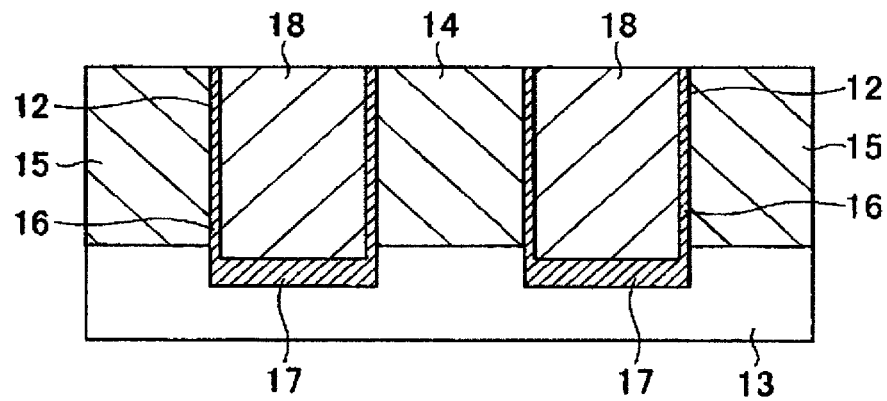
FIG. 3B is a schematic cross-sectional view along a line D-D' shown in FIG. 2.

As shown in FIG. 3A, which is a schematic cross-section of the memory cell transistor taken along a line A-A' of FIG. 2, and FIG. 3B, which is a schematic cross-section taken along a line D-D' of FIG. 2, a gate insulating film 16 is formed on a side surface of the gate trench 12. The gate insulating film 16 is not shown in FIG. 2 for brevity. Furthermore, an insulating film 17 thicker than the gate insulating film 16 is formed on the bottom of the gate trench 12. A trench gate electrode 18 is buried in the gate trench 12.

Figure 3C:
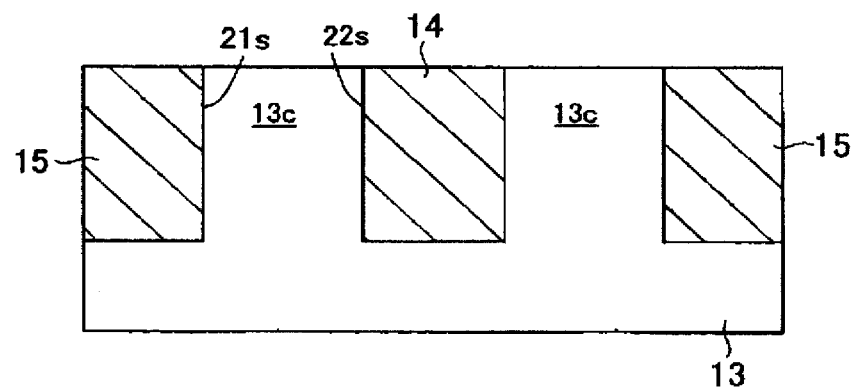
FIG. 3C is a schematic cross-sectional view along a line E-E' shown in FIG. 1B.
Figure 6D:
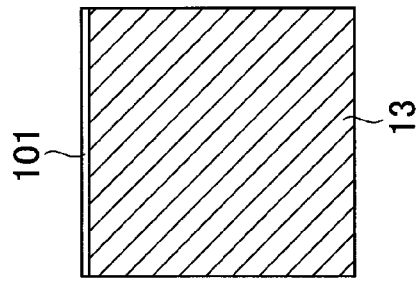
FIGS. 6A to 6D are cross-sectional views showing a step of forming a silicon oxide film in the first embodiment.
Figure 6C:
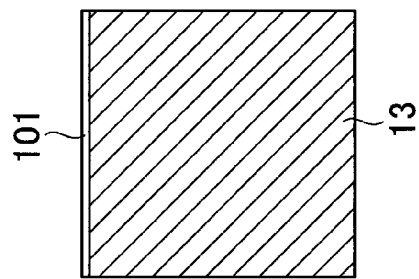
Figure 6B:
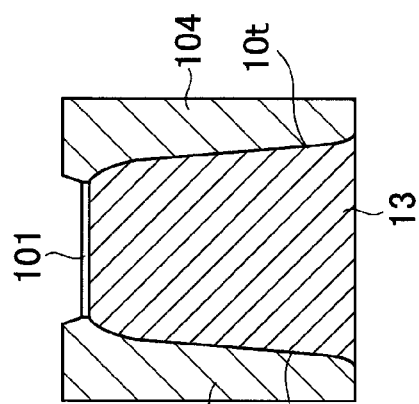
Figure 6A:
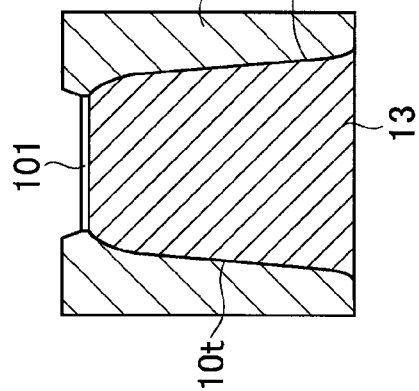

By so configuring the memory cell transistor, the part (a part of the semiconductor substrate 13) located between the side surface 11s of the active region 11 and the side surface 12s of the gate trench 12 and provided almost parallel to the side surface of the STI region 10 (and oblique or inclined to an upper surface of the semiconductor substrate/body 13) to be thin and plane can act as a channel region. Namely, as indicated by an arrow 19 in FIG. 2, current flows to side surfaces of the gate trench 12 adjacent to the STI region 10 in a Y direction when a potential difference between the gate electrode 18 and the source region 14 exceeds a threshold voltage. One of surfaces of the channel region 13c contacts with the STI region 10 (i.e., a first side surface) and the other surface thereof contacts with the gate insulating film 16 (i.e., a second side surface). That is, only the channel region that is part of the semiconductor substrate 13 is present between the STI region 10 and the gate insulating film 16. In addition, as shown in FIG. 3C, the channel region 13c includes a side interface 21s (i.e., a third side interface) adjacent to the drain region 15 and interfacing with one ends of the first and second side surfaces of the channel region 13c, and a side interface 22s (i.e., a fourth side interface) adjacent to the source region 14 and interfacing with other ends of the first and second side surfaces of the channel region 13c. Correspondingly, an additional one of the channel regions 13c is provided such that the current, as indicated by an arrow 19 in FIG. 2, also flows to another side surface of the gate trench 12 adjacent to another STI region 10 in the Y direction. Here, one of surfaces of the additional channel region 13c contacts with the STI region 10 (i.e., a fifth side surface) and the other surface thereof contacts with the gate insulating film 16 (i.e., a sixth side surface). Although not explicitly shown, but analogous to the features shown in FIG. 3C, the additional channel region 13c includes corresponding side interfaces (i.e., seventh and eighth side interfaces) adjacent to the drain and source regions 14 and 15 and interfacing with ends of the fifth and sixth side surfaces, respectively.

The portion 13c located between the side surfaces 11s and 12s, i.e., the channel region can be formed very thin. Therefore, it is possible to form the channel region 13c as a completely depleted region such as an SOI (Silicon On Insulator) structure. The thickness of the channel region 13c is preferably equal to or larger than 5 nm and equal to smaller than 25 nm to provide the completely depleted region.

Furthermore, by providing the insulating film 17 thicker than the gate insulating film 16 on the bottom of the gate trench 12, it is difficult to form an inversion layer, i.e., a channel on the bottom of the gate trench 12. Due to this, the thick insulating film 17 is set to have such a thickness as not to form the channel in the semiconductor substrate below the gate trench 12. It is, therefore, possible to limit the channel region of the memory cell transistor only to the portion 13c located between the side surface 11s of the active region 11 (the side surface of the STI region 10) and the side surface 12s of the gate trench 12. As a consequence, it is possible to suppress the short channel effect even if the impurity concentration of the semiconductor substrate is low. Accordingly, the junction leakage can be suppressed and the refresh characteristics can be improved.

A method of manufacturing the semiconductor device according to the first embodiment is explained below in detail with reference to FIGS. 4A to 4D to FIGS. 15A to 15D, while taking the DRAM as an example. FIGS. 4A to 4D to FIGS. 15A to 15D are process diagrams for schematically showing steps of manufacturing the semiconductor device according to the first embodiment. FIGS. 4A to 4C correspond to the A-A' cross-section, the B-B' cross-section, and the C-C' cross-section shown in FIG. 1B, respectively. FIG. 4D is a cross-section of peripheral circuits (the other regions of the semiconductor substrate that are not shown in FIG. 1B). The same is true for FIGS. 5A to 5D to FIGS. 15A to 15D.

As shown in FIGS. 4A to 4D, first, a pad oxide film 101 having a thickness of about 9 nm and a silicon nitride film 102 having a thickness of about 120 nm are formed on the semiconductor substrate 13. The pad oxide film 101 and the silicon nitride film 102 are patterned into the shape corresponding to the active region 11 shown in FIGS. 1A and 1B by a well-known photolithography technique.

As shown in FIGS. 5A to 5D, a sidewall oxide film 103 having a thickness of about 20 to 30 nm is formed on a side surface of the silicon nitride film 102. Thereafter, using the silicon nitride film 102 and the sidewall oxide film 103 as a mask, an STI trench 10t having a depth of about 250 nm is formed in the semiconductor substrate 13.

A silicon oxide film having a thickness of about 400 nm is formed on an entire surface including the interior of the trench 10t by means of HDP-CVD (High Density Plasma-Chemical Vapor Deposition). Using the silicon nitride film 102 as a stopper, the silicon oxide film on the semiconductor substrate 13 is polished and removed by CMP (Chemical Mechanical Polishing). The silicon nitride film 102 left after the end of the CMP is removed by wet etching using a hot phosphoric acid, thereby forming a silicon oxide film 104 in the trench 10t as shown in FIGS. 6A to 6D. As a result, the STI regions 10 (that is, the silicon oxide film 104) and the active regions 11 surrounded and isolated from one another by the STI region 10 shown in FIGS. 1A and 1B are completed.

Next, as shown in FIGS. 7A to 7D, a silicon nitride film 105 having a thickness of about 120 nm is formed on the entire surface.

As shown in FIGS. 8A to 8D, the silicon nitride film 105 is patterned so as to form an opening on a region in which the gate trench 12 is to be formed using a photoresist (not shown). Namely, the silicon nitride film 105 serves as a mask layer including the opening corresponding to the width of the gate trench 12 on the active region. Here, as shown in FIG. 8A, shoulder-shaped portions 104s are left on an upper end of the silicon oxide film 104 serving as the STI region.

As shown in FIGS. 9A to 9D, the pad oxide film 101 is removed by dry etching while using the patterned silicon nitride film 105 as a mask. As an etching gas, gas mixture of, for example, $CF_4$, $CHF_2$, and Ar can be used. During the dry etching, although the thin pad oxide film 101 is removed, only an upper surface of the thick silicon oxide film 104 is etched with the shoulder-shaped portions 104s left unetched (see FIG. 8A). Next, a dry etching having a high selectivity relative to the silicon nitride film 105 and the silicon oxide film 104 constituting the STI regions 10 is performed. Namely, the semiconductor substrate 13 is etched using the silicon nitride film 105 as a mask, thereby forming the gate trench 12 having a thickness of about 160 nm. As an etching gas for forming the gate trench 12, a gas mixture of, for example, $Cl_2$, HBr, and $O_2$ is used.

Figures 9A, 9B, 9C, 9D:
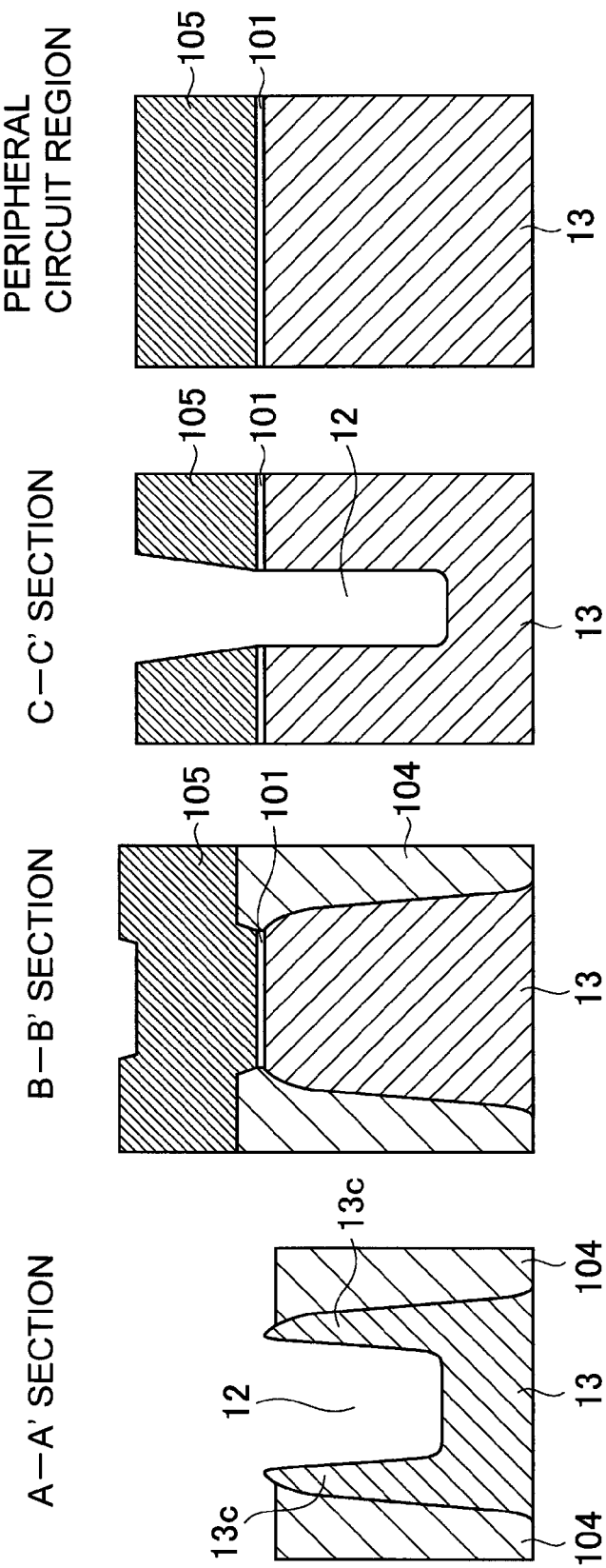
FIGS. 9A to 9D are cross-sectional views showing a step of forming a gate trench in the first embodiment.
Figure 13D:
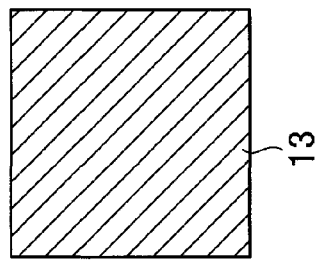
FIGS. 13A to 13D are cross-sectional views showing a step of removing a pad oxide film in the first embodiment.
Figure 13C:
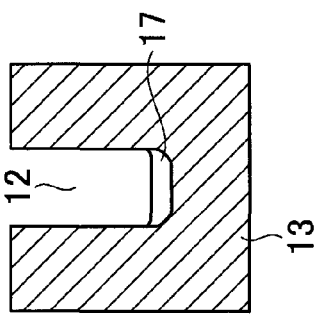
Figure 13B:
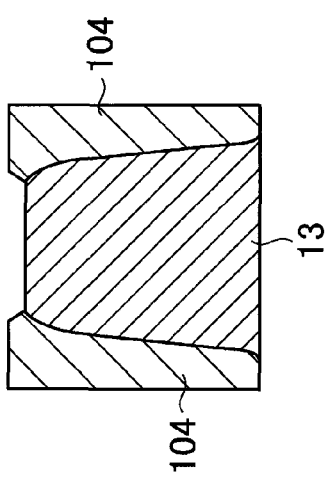
Figure 13A:
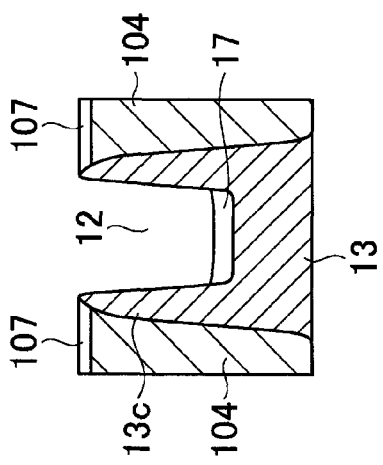

The dry etching for forming the gate trench 12 has the high selectivity relative to not only the silicon nitride film 105 but also the silicon oxide film 104. Due to this, the shoulder-shaped portions 104s (see FIG. 8A) of the silicon oxide film 104 serve as a mask so that the thin portion 13c of the semiconductor substrate 13 is left on the both sides of the gate trench 12 without being etched as shown in FIG. 9A. The thickness of each thin portion 13c of the semiconductor substrate 13 is about 15 to 35 nm.

As shown in FIGS. 10A to 10D, a sacrificial oxide film 106 having a thickness of about 10 nm is formed on an inner surface of the gate trench 12 by thermal oxidation. Thereafter, a silicon oxide film 107 having a thickness of about 50 nm is formed on the entire surface by the HDP-CVD. During the formation, the silicon oxide film 107 is formed to be thick on the bottom of the gate trench, the upper surface of the silicon oxide film 104, and the upper surface of the silicon nitride film 105 and to be thin on the side surfaces of the gate trench 12 because of characteristics of the HDP-CVD.

As shown in FIGS. 11A to 11D, the silicon oxide film 107 on the silicon nitride film 105 is removed by the CMP.

The thin silicon oxide film 107 formed on the side surface of the opening of the silicon nitride film 105 is removed by wet etching for a short time using hydrogen fluoride or the like. Thereafter, as shown in FIGS. 12A to 12D, the silicon nitride film 105 is removed by wet etching using hot phosphoric acid.

As shown in FIGS. 13A to 13D, the side surface of the gate trench 12 and the pad oxide film 101 are removed by wet etching. At this time, the upper portion of the silicon oxide film 107 on the bottom of the gate trench 12 is also etched to be thin. However, etching conditions such as an etching time of the wet etching are set so that the thickness (including the thickness of the sacrificial oxide film 106) of the silicon oxide film 107 is larger than the thickness of a gate insulating film to be formed on the side surface of the gate trench 12 later. By so setting, a thick insulating film 17 (including the sacrificial oxide film 106) having a thickness of about 20 nm to 30 nm is formed on the bottom of the gate trench 12. Because of formation of the thick insulating film 17 on the bottom of the gate trench 12, the silicon oxide film 107 is left on the upper surface of the silicon oxide film 104. However, since the silicon oxide film 107 has no adverse influence on the semiconductor device according to the first embodiment, it is not always necessary to remove the silicon oxide film 107, and the silicon oxide film 107 can be left as it is.

Thereafter, as shown in FIGS. 14A to 14D, a gate insulating film 16 having a thickness of about 8 nm is formed on the entire surface including the side surface of the gate trench 12 and the semiconductor substrate 13 in the peripheral circuit region. A doped polycrystalline silicon (DOPOS) film 109 having a thickness of about 100 nm is formed on the entire surface including the interior of the gate trench 12. A W/WN film 110 configured so that a tungsten (W) film having a thickness of about 70 nm is formed on a tungsten nitride (WN) film having a thickness of about 5 nm is formed on the DOPOS film 109 as a metal layer. Furthermore, a silicon nitride film 111 having a thickness of about 140 nm is formed on the W/WN film 110. Multiple layers of the DOPOS film 109, the W/WN film 110, and the silicon nitride film 111 are patterned into the shape of a gate electrode. As a consequence, a trench gate electrode 18 of the memory cell transistor, including a first portion in which a part of the DOPOS film 109 is buried in the gate trench 12 and a second portion continuous with the first portion and protruding from the surface of the semiconductor substrate 13 is formed in the memory cell region. Likewise, a gate electrode 112 of the peripheral circuit transistor is formed in the peripheral circuit region.

Next, as shown in FIGS. 15A to 15D, the source region 14 and the drain region 15 each having a depth of about 80 nm are formed on both sides of the gate trench 12 with respect to the extension direction of the gate trench 12 by implanting ions into the memory cell region while covering the peripheral circuit region with a resist mask (not shown) and using the trench gate electrode 18 of the memory cell transistor as a mask. Next, source and drain regions 113 are formed by implanting ions into the peripheral circuit region while covering the memory cell region with a resist mask (not shown) and using the gate electrode 112 of the peripheral circuit transistor as a mask.

Furthermore, sidewall insulating films 114 having a thickness of about 25 nm are formed on side surfaces of the trench gates 18 and 112, respectively, and a contact plug 115 is then formed.

Although not shown in the drawings, thereafter, a memory cell capacitor, a wiring, and the like are formed by normal method, and the DRAM is thus completed.

As described so far, according to the first embodiment, as shown in FIG. 15A, the portion 13c located between the side surface 11s of the silicon oxide film 104, i.e., the STI region 10 and the side surface 12s of the gate trench 12 can serve as the channel region. The thickness of the portion 13c serving as the channel region can be made quite small by adjusting the distance between the silicon oxide film (the STI region) 104 and the gate trench 12, the inclination angle of the side surface of the STI trench 10t (see FIGS. 5A to 5D), and the like. The channel region 13c can be, therefore, made completely depleted. Further, as shown in FIG. 15C, the insulating film 17 thicker than the gate insulating film 15 is formed on the bottom of the gate trench 12. It is thereby possible to reduce the parasitic capacitance of the trench gate electrode 18, i.e., the word line 12w. Therefore, the concentration of the semiconductor substrate 13 can be reduced to thereby improve the refresh characteristics, and the parasitic capacitance of the word line 12w (the trench gate electrode 18) can be reduced to thereby accelerate the operation rate of the circuit.

Furthermore, if the depth of the STI region 10 (the silicon oxide film 104) and that of the gate trench 12 are increased, the channel width (that is, the height of the channel region 13c in FIG. 5A) can be increased. Therefore, it is possible to form a transistor in which current can be sufficiently applied without increasing the area of the element, even if the voltage applied to the gate electrode is set low.

An ordinary trench-gate transistor is explained below with reference to FIGS. 15A to 15D. The insulating film 17 on the bottom of the gate trench 12 is not as thick as that according to the first embodiment, and is as thick as the gate insulating film 16 so that the insulating film 17 can function as the gate insulating film. The region from the source region 14 to the drain region 15 through the source region 14-side side surface of the gate trench 12, the bottom of the gate trench 12, and the drain region 15-side side surface of the gate trench 12 is used as the channel region of the ordinary trench-gate transistor in FIG. 15C.

Further, the portion 13c of the semiconductor substrate 13 serving as the channel region in the present embodiment is normally either formed into an oxide film by performing oxidation or the like after the step shown in FIGS. 9A to 9D and before the step shown in FIGS. 10A to 10D so that the oxide film becomes a part of the STI region 10 (the silicon oxide film 104) or removed by etching or the like so that the portion 13c does not function as the channel region. The reason is as follows. If the portion 13c of the semiconductor substrate 13 is left in the ordinary trench-gate transistor, such problems as increase of a leakage current occur.

In the present embodiment, the part 13 of the semiconductor substrate 13 is intentionally left, and the insulating film 17 on the bottom of the gate trench 12 is made thick so that the part of the semiconductor substrate 13 below the bottom of the gate trench 12 does not serve as the channel region. By doing so, only two side surfaces of the gate trench 12 shown in FIG. 15A serve as the channel region. It is thereby possible to achieve a substantially completely depleted transistor and considerably improve the performance of the trench-gate transistor.

Second Embodiment

As a second embodiment of the present invention, an example of changing the step of forming the thick insulating film 17 on the bottom of the gate trench is explained below. If the size of the gate trench 12 is reduced, and the silicon oxide film 107 on the silicon nitride film 105 is removed by the CMP (see FIGS. 10A to 10D to FIGS. 11A to 11D and explanations thereof) in the process of forming the thick insulating film 17 on the bottom of the gate trench 12 (the steps shown in FIGS. 10A to 10D to 13A to 13D according to the first embodiment) as shown in FIGS. 10A to 10D and 11A to 11D, then slurry used for the CMP is often left in the gate trench 12, and it often takes a long cleaning time to remove the slurry. In the second embodiment, therefore, the thick insulating film 17 is formed without using the CMP. To do so, steps shown in FIGS. 16A to 16D to 18A to 18D are executed in place of the steps shown in FIGS. 11A to 11D to 13A to 13D according to the first embodiment. The method of the second embodiment is explained with reference to FIGS. 16A to 16D to 18A to 18D.

First, similarly to the steps shown in FIGS. 4A to 4D to 10A to 10D according to the first embodiment, steps up to formation of the silicon oxide on the entire surface by the HDP-CVD are executed.

Next, as shown in FIGS. 16A to 16D, a TEOS-NSG (Non-doped Silicate Glass) oxide film 200 is formed by the CVD. The TEOS-NSG oxide film is a silicon oxide film formed by the CVD using tetraethoxysilane ($Si(OC_2H_5)_4$) as a material.

The TEOS-NSG oxide film 200 and the silicon oxide film 107 are etched back by dry etching. As a result, as shown in FIGS. 17A to 17D, the TEOS-NSG oxide film 200 and the silicon oxide film 107 on the silicon nitride film 105 are removed. In this manner, according to the second embodiment, the silicon oxide film 107 is removed without using the CMP. As a result, a part of the TEOS-NSG oxide film 200 is left in the gate trench 12.

The TEOS-NSG oxide film 200 and the silicon oxide film 107 are removed by wet etching, and the silicon nitride film 105 is removed by wet etching, thereby obtaining the structure shown in FIGS. 18A to 18D. Namely, the TEOS-NSG oxide film 200 and the silicon nitride film 105 are removed, and the silicon oxide film 107 and the sacrificial oxide film 106 are left in the gate trench 12.

The wet etching for removing the TEOS-NSG oxide film 200 is performed using a solution (e.g., hydrogen fluoride) generally used to remove the silicon oxide film. The etching rate of etching the TEOS-NSG oxide film 200 using the solution is ten times as high as that of etching the silicon oxide film 107 formed by the HDP-CDP. Due to this, the TEOS-NSG oxide film 200 is quickly removed and is not left in the gate trench 12. The wet etching performed on the oxide film is finished when the TEOS-NSG oxide film 200 is removed. Next, as already described, the silicon nitride film 105 is removed by the wet etching. The silicon oxide film 107 formed on the side surface of the opening of the silicon nitride film 105 is very thin. Due to this, the silicon oxide film 107 is also removed by the wet etching for removing the TEOS-NSG oxide film 200.

The remaining silicon oxide film is then subjected to wet etching, thereby removing the upper part on the side surface of the gate trench 12 and the pad oxide film 101. As a result, the same structure as that show in FIGS. 13A to 13D according to the first embodiment is obtained. Namely, the silicon oxide film 107 (including the sacrificial oxide film 106) is left only on the bottom of the gate trench 12. The thickness of the silicon oxide film 107 (including the sacrificial oxide film 106) is set to about 20 nm to 30 nm so as to be larger than the thickness of the gate insulating film to be formed later on the side surface of the gate trench 12 similarly to the first embodiment.

Since the subsequent steps are the same as those according to the first embodiment, they will not be explained herein.

In this manner, according to the second embodiment, the thick silicon oxide film 107 can be formed on the bottom of the gate trench 12 without using the CMP. Therefore, it is possible to dispense with the long cleaning time required if the CMP is used.

The present invention is in no way limited to the aforementioned embodiments, but rather various modifications are possible within the scope of the invention as recited in the claims, and naturally these modifications are included within the scope of the invention.

In the above embodiments, to form the silicon oxide film 107, for example, the HDP-CVD is used. However, the present invention is not limited thereto and the other method can be used to form the silicon oxide film 107 as long as the silicon oxide film 107 can be formed to be thin on the side surface of the gate trench 12.

In the above embodiments, the present invention is applied to the memory cell transistor of the DRAM. However, the present invention is not limited to the memory device but can be similarly applied to a logic device.

What is claimed is:

1. A semiconductor device, comprising:
   a semiconductor body of a first conductivity type;
   a channel region of the first conductivity type projecting from a part of the semiconductor body with an upwardly tapered shape, the channel region thereby including a first side surface which is inclined with respect to an upper surface of the semiconductor body, a second side surface which is opposite to the first side surface and inclined with respect to the upper surface of the semiconductor body, a third side interface which interfaces between respective one ends of the first and second side surfaces, and a fourth side interface which is opposite to the third side interface to interface between respective other ends of the first and second side surfaces;
   a first region formed on a side of the third side interface of the channel region;
   a second region formed on a side of the fourth side interface of the channel region, each of the first and second regions being of a second conductivity type, and the first and second regions being arranged in line in a first direction;
   a gate structure running in a second direction crossing the first direction and forming a current path between the first and second regions along the first side surface of the channel region;
   an additional channel region of the first conductivity type projecting from another part of the semiconductor body with an upwardly tapered shape, the additional channel region thereby including a fifth side surface which is inclined with respect to the upper surface of the semiconductor body, a sixth side surface which is opposite to the fifth side surface and inclined with respect to the upper surface of the semiconductor body, a seventh side interface which interfaces between respective one ends of the fifth and sixth side surfaces, and an eighth side interface which is opposite to the seventh side interface to interface between respective other ends of the fifth and sixth side surfaces, the seventh side interface being on a side of the first region;
   a third region formed on a side of the eighth side interface of the additional channel region, the third region being of a second conductivity type and the first to third regions being arranged in line in the first direction; and
   an additional gate structure running in the second direction and forming an additional current path between the first and third regions along the fifth side surface of the additional channel region.

2. The device as claimed in claim 1, wherein the gate structure comprises a gate insulating film covering the first side surface of the channel region and a gate electrode formed on the gate insulating film.

3. The device as claimed in claim 2, further comprising an isolation region covering the second side surface of the channel region, the isolation region comprising an insulating material.

4. The device as claimed in claim 1, wherein the additional gate structure comprises an additional gate insulating film covering at least the fifth side surface of the additional channel region and an additional gate electrode formed on the additional gate insulating film.

5. The device as claimed in claim 4, further comprising an additional isolation region covering the sixth side surface of the additional channel region, the additional isolation region comprising an insulating material.

6. A semiconductor device, comprising:
   a semiconductor body of a first conductivity type including first, second, third, fourth and fifth parts arranged in line in a first direction, the second part intervening between the first and third parts and the fourth part intervening between the third and fifth parts;
   a first diffusion region of a second conductivity type formed over the first part of the semiconductor body;
   a first channel region of the first conductivity type projecting from the second part of the semiconductor body with an upwardly tapered shape, the first channel region thereby including a first side surface which is inclined with respect to an upper surface of the second part of the semiconductor body, a second side surface which is opposite to the first side surface and inclined with respect to the upper surface of the second part of the semiconductor body, a third side interface which interfaces between respective one ends of the first and second side surfaces, and a fourth side interface which is opposite to the third side interface to interface between respective other ends of the first and second side surfaces;

a second diffusion region of the second conductivity type formed over the third part of the semiconductor body;

a second channel region of the first conductivity type projecting from the fourth part of the semiconductor body with an upwardly tapered shape, the second channel region thereby including a fifth side surface which is inclined with respect to an upper surface of the fourth part of the semiconductor body, a sixth side surface which is opposite to the fifth side surface and inclined with respect to the upper surface of the fourth part of the semiconductor body, a seventh side interface which interfaces between respective one ends of the fifth and sixth side surfaces, and an eighth side interface which is opposite to the seventh side interface to interface between respective other ends of the fifth and sixth side surfaces;

a third diffusion region of the second conductivity type formed over the fifth part of the semiconductor body;

a first gate structure running in a second direction crossing the first direction and forming a current path between the first and second diffusion regions along the first side surface of the first channel region; and a second gate structure running in the second direction and forming a current path between the second and third diffusion regions along the fifth side surface of the second channel region.

7. The device as claimed in claim 6, wherein the first gate structure comprises a first gate insulating film covering the first side surface of the first channel region and a first gate electrode formed on the first gate insulating film, and the second gate structure comprises a second gate insulating film covering the fifth side surface of the second channel region and a second gate electrode formed on the second gate insulating film.

8. The device as claimed in claim 7, further comprising an isolation region covering the second side surface of the first channel region and the sixth side surface of the second channel region, the isolation region comprising an insulating material.

9. A semiconductor device, comprising:
a semiconductor body of a first conductivity type;
a channel region of the first conductivity type projecting from a part of the semiconductor body with an upwardly tapered shape so that an upper portion of the channel region is smaller than a bottom portion of the channel region, the channel region including a first side surface which is inclined with respect to an upper surface of the semiconductor body, a second side interface at one end of the first side surface, and a third side interface at the other end of the first side surface;

a first region formed on a side of the second side interface of the channel region;

a second region formed on a side of the third side interface of the channel region, each of the first and second regions being of a second conductivity type, and the first and second regions being arranged in line in a first direction;

a gate structure running in a second direction crossing the first direction and formed on the first side surface of the channel region to form a current path between the first and second regions along the first side surface of the channel region;

an additional channel region of the first conductivity type projecting from another part of the semiconductor body with an upwardly tapered shape so that an upper portion of the additional channel region is smaller than a bottom portion of the additional channel region, the additional channel region including a fourth side surface which is inclined with respect to the upper surface of the semiconductor body, a fifth side interface at one end of the fourth side surface, and a sixth side interface at the other end of the fourth side surface, the fifth side interface being on a side of the first region;

a third region formed on a side of the sixth side interface of the addition channel region, the third region being of a second conductivity type and the first to third regions being arranged in line in the first direction; and an additional gate structure running in the second direction and formed on the fourth side surface of the additional channel region to form an additional current path between the first and third regions along the fourth side surface of the additional channel region.

10. The device as claimed in claim 9, wherein the gate structure includes a gate insulating film formed on the first side surface of the channel region and a gate electrode formed on the gate insulating film, and the additional gate structure includes an additional gate insulating film formed on the fourth side surface of the additional channel region and an additional gate electrode formed on the additional gate insulating film.

* * * * *